United States Patent [19]

Srivastava

[11] Patent Number: 5,184,091

[45] Date of Patent: Feb. 2, 1993

[54] CIRCUIT FOR PHASE LOCKING AN OSCILLATOR WITHIN ANY ONE OF A PLURALITY OF FREQUENCY RANGES

[75] Inventor: Gopal K. Srivastava, Arlington Heights, Ill.

[73] Assignee: Zenith Electronics Corporation, Glenview, Ill.

[21] Appl. No.: 709,939

[22] Filed: Jun. 4, 1991

[51] Int. Cl.[5] .......................... H03L 7/06; H04N 5/05
[52] U.S. Cl. ........................................ 331/10; 331/20; 331/25; 358/158
[58] Field of Search ..................... 331/10, 11, 12, 17, 331/20, 25; 358/158, 159

[56] References Cited

U.S. PATENT DOCUMENTS

| | | | |
|---|---|---|---|
| 4,680,555 | 7/1987 | Waldeck | 358/158 X |
| 4,761,587 | 8/1988 | Wharton | 358/159 X |
| 4,991,023 | 2/1991 | Nicols | 358/242 |
| 4,996,596 | 2/1991 | Hirao et al. | 358/158 |

*Primary Examiner*—Siegfried H. Grimm

[57] ABSTRACT

An adaptive oscillator control system for use in television receivers or monitors includes a phase locked loop together with a static phase error correction system which responds to long term error signals of significant magnitude within the phase locked loop to adjust the free-running frequency of the oscillator. An oscillator range control includes a processor having a plurality of established oscillator frequency ranges which are identified by oscillator range code numbers. A measuring counter and clock circuit cooperate to count the number of clock signals occurring during the horizontal sync reference signal period to establish a frequency reference number. A first frequency approximation is provided based upon the oscillator range code number or a known standard scan frequency. A frequency detector examines the oscillator output and provides a second frequency approximation to adjust the oscillator frequency until it falls within the appropriate frequency range. A confidence circuit examines the consistency of oscillator frequency maintenance within the appropriate frequency range and upon establishing the desired confidence level enables the phase locked loop to provide synchronization. Thereafter, a lock detector responds to the occurrence of frequency and phase lock by the phase lock loop to enable the static phase error corrector and deactivate the oscillator range control system. The lock detector upon detecting horizontal synchronization, for broadcast type video, increases the second frequency approximation range.

28 Claims, 4 Drawing Sheets

| ORC RANGE WINDOW | | |
|---|---|---|
| ORC | START | END |
| 0 | 840 | 968 |
| 1 | 736 | 864 |
| 2 | 640 | 752 |
| 3 | 552 | 656 |
| 4 | 480 | 568 |
| 5 | 416 | 496 |
| 6 | 368 | 432 |
| 7 | 320 | 376 |
| 8 | 272 | 328 |
| 9 | 240 | 280 |
| 10 | 208 | 248 |
| 11 | 176 | 216 |
| 12 | 152 | 184 |
| 13 | 136 | 160 |
| 14 | 120 | 140 |
| 15 | 104 | 124 |

Fig. 4

CIRCUIT FOR PHASE LOCKING AN OSCILLATOR WITHIN ANY ONE OF A PLURALITY OF FREQUENCY RANGES

CROSS REFERENCE TO RELATED PATENT APPLICATION

This application is related to a copending application Ser. No. 07/682,484, filed Apr. 9, 1991 and entitled STATIC PHASE ERROR RESPONSIVE OSCILLATOR CONTROL, which is assigned to the assignee of the present application and which is hereby incorporated herein by reference.

FIELD OF THE INVENTION

This invention relates generally to video displays and particularly to the synchronization and control of display scan systems therein.

BACKGROUND OF THE INVENTION

Several different types of television broadcast formats and standards are used in different locales throughout the world. Two of the most pervasive are the system used in the United States of America known as NTSC (National Television Standards Committee) and the European system known as PAL (Phase Alternating Line). In addition, several systems for providing increased picture resolution or definition, generally referred to as HDTV (High Definition Television) have been and are continuing to be developed.

While the television receivers operating in these varied systems are equally varied, certain aspects remain generally similar. For example, most television receivers include circuitry for selecting the desired television signal from among a plurality of broadcast signals available, a signal processing system which recovers the picture and sound information from the broadcast signal, systems for sequentially scanning a display device such as a cathode ray tube in both horizontal and vertical directions, and scan synchronization systems operative upon the display to coordinate display scanning to the picture and sound information.

Despite significant differences between the signal selection and signal processing functions of television receivers operating in accordance with the above-mentioned variety of broadcast systems, the functions of display scanning and synchronization are generally quite similar. Generally, picture and sound information together with scan synchronizing signal are modulated upon a broadcast carrier at the transmitter. At the receiver, the scan synchronizing signals are separated from the remainder of the picture and sound information and used to control locally generated horizontal and vertical scan signals. The latter are used to drive the scanning circuits of the display system.

Computer monitors and many video game devices are also similar to television receivers in that they include a display system, such as a cathode ray tube, which is scanned in synchronism with picture information. In such systems, the scan signals are computer generated and are used to synchronize display scan and picture information in much the same manner as television receivers.

Because the horizontal scan oscillator control used in the variety of television receivers, computer monitors and video game displays are substantially identical in overall function, it seems logical to provide a single system which may be operated for all such uses (e.g. a "universal" system). However, attempts to do so have been frustrated largely by the broad range of scan frequencies over which such a universal scan control system would be required to operate.

As is well known, the operation of display system synchronization controlling the horizontal scan oscillator is extremely demanding. Meeting these demands is made challenging by the need for precise control of both the frequency and phase of the horizontal scan oscillator. Maintaining frequency control over a broad range of reference scan frequencies generally leads to systems which lack stable precise phase control. Conversely, highly precise stable phase locking systems usually lack the ability to accommodate a wide range of frequencies.

For example, one of the most common and pervasive horizontal scan oscillator control systems used in television receivers, computer monitors, or video games is generally referred to as a phase locked loop. While a variety of different phase locked loop systems have been developed, the prior art system shown in FIG. 1 is typical and provides a helpful basis for understanding the limitations and problems associated with conventional horizontal oscillator control.

Thus, with reference to FIG. 1, a typical phase locked loop system is shown which is constructed in accordance with the prior art and generally referenced by numeral 10. A sync signal separator 12 operates in accordance with conventional fabrication techniques to extract the horizontal scan synchronizing signals from the remainder of the received television signal to provide a reference signal input to a conventional phase detector 11. Phase detector 11 includes a pair of inputs 13A and 13B. Input 13A is coupled to sync separator 12 and 13B is coupled to the output of frequency divider 19. Phase detector 11 produces an output signal at output 14 representative of the difference between inputs 13A and 13B. The output of phase detector 11 is coupled to a low pass filter 16 which in turn is coupled to an error amplifier 17. A voltage controlled oscillator 18 having an output frequency determined in part by the error signal applied by error amplifier 17 produces a periodic output signal which is coupled to a frequency divider 19. The output of frequency divider 19 is applied to input 13B of phase detector 11 and to the horizontal scan system.

In operation, phase detector 11 compares the output signal of frequency divider 19 to the reference synchronizing signals at input 13A. An error voltage indicative of the difference therebetween is filtered by low pass filter 16 and amplified by error amplifier 17 to produce a controlling voltage for voltage controlled oscillator 18. In the event voltage controlled oscillator 18 is precisely synchronized to the referenced synchronizing signals at input 13A, the output voltage of phase detector 11 is zero and the frequency of voltage controlled oscialltor 18 remains unchanged. In practice, however, this condition seldom exists and, more typically, the frequency of voltage controlled oscillator 18 differs from that of the incoming reference signals. If the difference between oscillator 18 and the reference signals detected by phase detector 11 is a phase difference or minor frequency difference, the error voltage coupled to oscillator 18 by filter 16 and amplifier 17 causes oscillator 18 to change frequency in the direction which brings its output signal toward synchronization with the reference sync signals. It has been found that prior art systems of the type shown in FIG. 1 respond well to minor variations of phase and frequency between oscillator 18 and the reference synchronizing signals.

If, however, a substantial frequency difference exists between the frequency of signals produced by oscillator 18 and the reference synchronizing signals, a correspondingly large error voltage is produced by phase detector 11 which is amplified by error amplifier 17 to produce a compensating change of frequency in voltage control oscillator 18. As is well known, conventional phase locked loop systems respond to large frequency differences by reaching an equilibrium point in which a sufficient error voltage is maintained by the phase detector to provide the necessary control of the oscillator. This equilibrium results in a condition in which the frequency of oscillator 18 is synchronized to that of the incoming reference sync signals while a phase difference or phase error between oscillator output signals and sync signals remains. This phase error is referred to in the art as static phase error. In systems of the type shown in FIG. 1, the ability of the system to make large frequency compensations is accompanied by correspondingly large static phase errors. Thus, practitioners in the art generally must compromise overall system performance to provide the necessary frequency compensation characteristic at the expense of static phase error.

In attempting to minimize or overcome the need for such compromise of system performance, and thereby accommodate a wider range of scan frequencies, practitioners in the art have endeavored to provide improved more flexible systems. Such attempts have included multiple loop control systems and systems which alter the effective control loop gain in response to frequency lock or out of lock conditions. While such attempts have improved certain aspects of the system performance, they have often been beset by difficulties associated with increased complexity and/or transition difficulties between the in-sync and out-of-sync condition of system operation. There remains, therefore, a need in the art for an improved horizontal scan oscillator control system which is capable of use in a wide range of scan frequencies while concurrently minimizing static phase error.

Accordingly, it is general object of the present invention to provide an improved horizontal scan oscillator control system operable in response to a broad range of scan frequencies. It is a more particular object of the present invention to provide an improved horizontal oscillator control system which responds to broad frequency signals while correcting static phase error.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

FIG. 4 sets forth a sample look-up table of oscillator ranges and frequencies in accordance with the present invention.

DESCRIPTION OF THE PREFERRED EMBODIMENT

Figure 1:
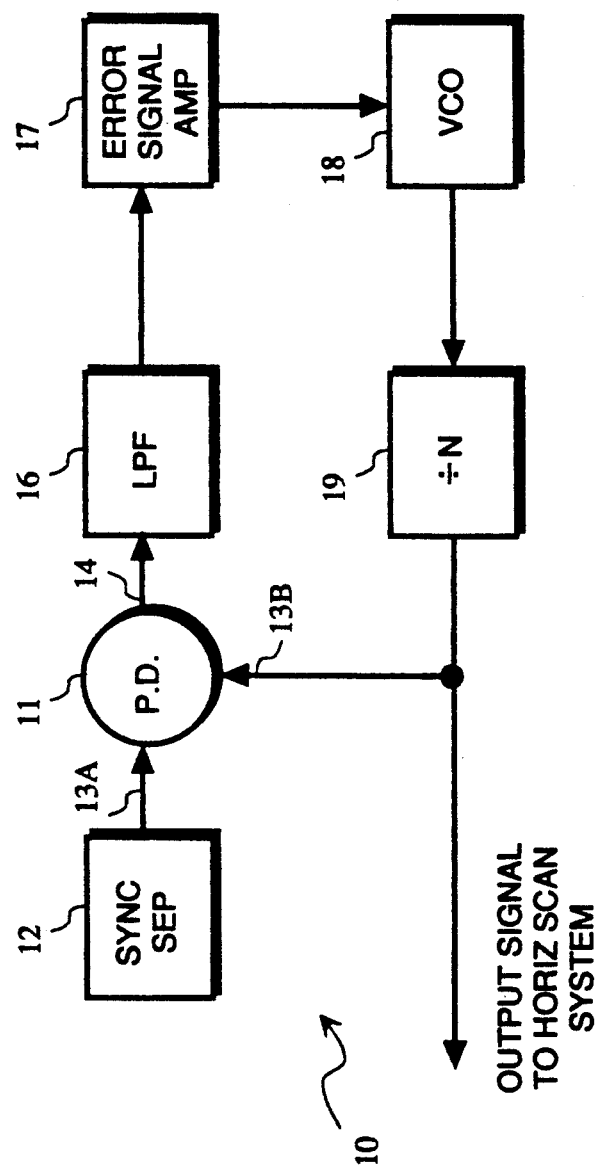
FIG. 1 sets forth a typical prior art phase locked loop system.
Figure 2:
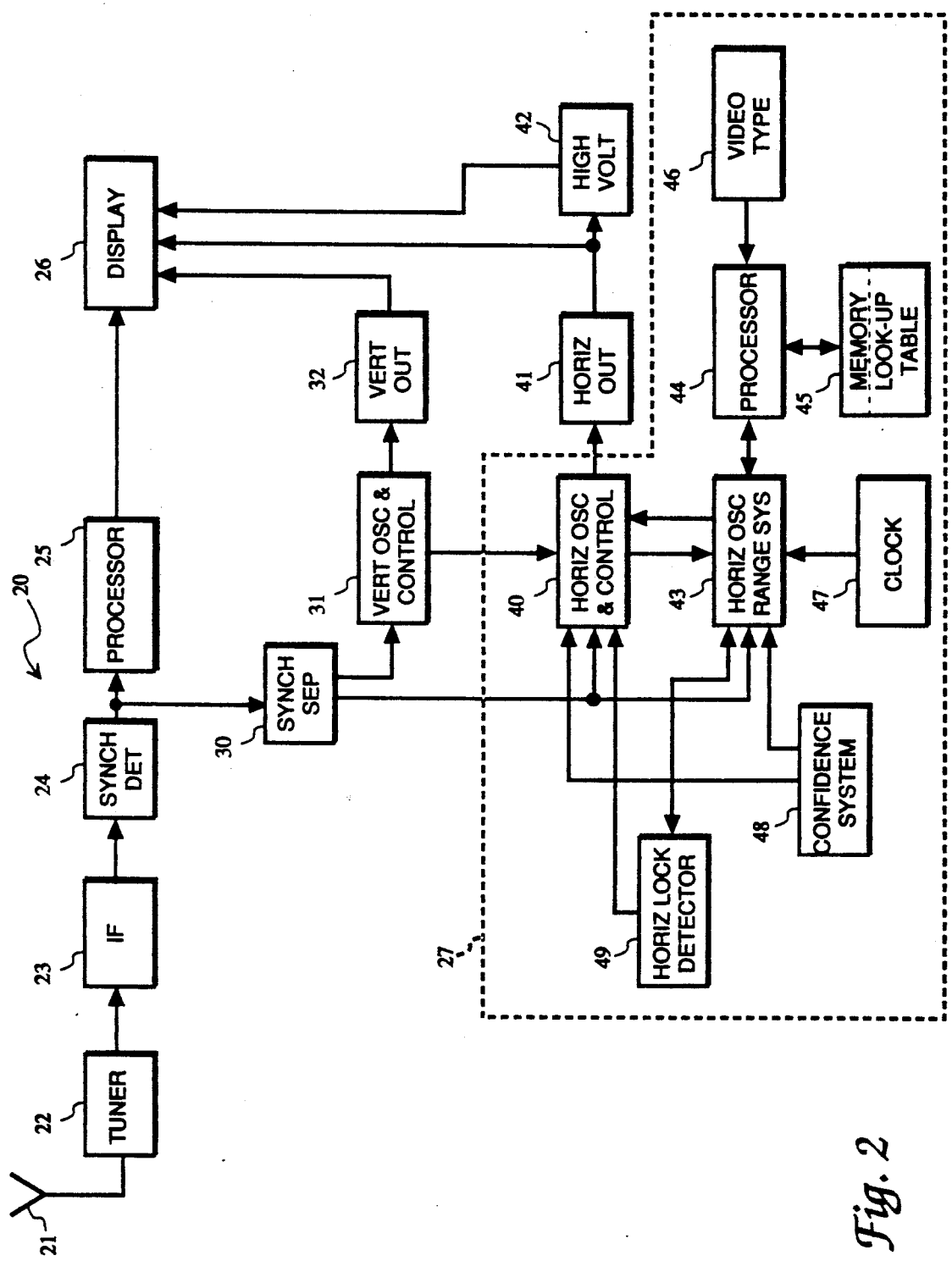
FIG. 2 sets forth a block diagram of a television receiver constructed in accordance with the present invention.

FIG. 2 sets forth a block diagram of a television receiver constructed in accordance with the present invention and generally referenced by numeral 20. Receiver 20 includes a receiving antenna 21 coupled to a tuner 22. Tuner 22 is coupled to an intermediate frequency system 23 which in turn is coupled to a synchronous detector 24. A signal processor 25 which includes conventional systems for processing picture and sound information is coupled to a display 26. A sync signal separator 30 is coupled to the output of synchronous detector 24. A vertical scan oscillator and control system 31 is coupled to sync separator 30 and a vertical output amplifier 32. The latter is coupled to display 26. A horizontal scan oscillator and control system 40 is coupled to sync separator 30 and a horizontal output amplifier 41. The latter is coupled to display 26 and a high voltage generator 42. High voltage generator 42 produces the high voltage potential required for display 26.

A horizontal oscillator range system constructed in accordance with the present invention and referenced by numeral 43 is coupled to horizontal oscillator and control 40. A clock circuit 47 is coupled to horizontal oscillator range control system 43. A processor 44, which in its preferred form comprises a conventional microprocessor, is coupled to horizontal oscillator range system 43 and includes a processor memory 45 which in turn includes a look-up table to be described below in greater detail. A source of video-type information 46 is coupled to processor 44. A horizontal lock detector 49 is coupled to horizontal oscillator and control 40 and to horizontal oscillator range system 43. A confidence system 48 is coupled to horizontal oscillator range and control 40 and horizontal oscillator range system 43. To facilitate the discussions which follow, horizontal oscillator and control 40, horizontal oscillator range system 43, processor 44, memory 45, video-type source 46, clock circuit 47, confidence system 48 and horizontal lock detector 49 are collectively grouped within the dashed line area of FIG. 2 and will be generally referred to as adaptive horizontal scan system 27 in the discussions which follow. With the exception of adaptive horizontal scan system 27, television receiver 20 may be constructed in accordance with virtually any of the known conventional fabrication techniques.

Accordingly, antenna 21 receives one or more broadcast television signals which are applied to tuner 22. Tuner 22 includes conventional channel selection systems for selecting the desired one of the plurality of signals received by antenna 21 and for converting the selected signal to an intermediate frequency signal which is further processed by intermediate frequency processor 23. Synchronous detector 24 operates upon the intermediate frequency signal to recover the picture, sound, and scan synchronizing signals modulated thereon. The picture information is further processed by signal processor 25 to produce appropriate picture information signals to control display 26.

Sync separator 30 extracts the vertical and horizontal scan synchronizing signals from the composite signal at the output of synchronous detector 24 and applies them to vertical scan oscillator and control 31, horizontal scan oscillator and control 40 and to horizontal range system 43. In response to the applied vertical scan signals from sync separator 30, vertical oscillator and control 31 produces a synchronized vertical scan signal which is amplified by vertical scan output system 32 and applied to display 26 to produce the vertical scan thereof.

The operation of adaptive horizontal scan system 27 is best understood by bearing in mind that the present invention system is capable of responding to a wide variety of television broadcast signal formats as well as a variety of non-broadcast uses such as color monitors or other display drive systems. Accordingly, the present invention system divides the spectrum of frequencies to be encountered into a plurality of oscillator frequency ranges. Thereafter, the system examines the horizontal synchronization signals if a nonstandard signal is being processed or the known scan frequency if a standard signal is received to identify the oscillator frequency range and establish a first approximation of horizontal oscillator frequency. The oscillator frequency is then adjusted to a second frequency approximation until the horizontal oscillator remains within the established frequency range for a predetermined period of time. Finally, the system activates a phase-locked loop and operates to minimize the static phase error within the loop in a final frequency adjustment.

Returning to FIG. 2, the horizontal synchronization signals produced by sync separator 30 are applied to horizontal oscillator and control 40 and to horizontal oscillator range system 43. In addition, a video-type signal which identifies the type of signal being received (i.e. NTSC, PAL, HDTV, or Monitor) is applied to processor 44. For standard broadcast signals, the horizontal scan frequency is known and the correct oscillator range can be determined directly. However, for nonstandard or monitor-type signals, the horizontal scan frequency is not known and a known relationship between the color subcarrier and the horizontal scan does not exist. Therefore, in such case, horizontal oscillator range system 43 responds to the applied horizontal sync signals and counts the number of clock signals from clock circuit 47 which occur during the period between horizontal sync signals. This number of clock signals occurring during the sync interval provides a convenient number for referencing the synchronization signal frequency and is coupled to processor 44. As is set forth below in FIG. 4 in greater detail, the look-up table within memory 45 of processor 44 provides an organized correlation between this clock signal number and the oscillator frequency range within which the oscillator must be operated for synchronization. In addition, the memory within look-up table 45 provides a corresponding oscillator range control number for each frequency range. Thus, processor 44 examines the look-up table within memory 45 and couples the corresponding oscillator range control number to horizontal oscillator range system 43. Horizontal oscillator range system 43 converts the oscillator range control number to an analog control signal which is applied to horizontal oscillator and control 40 to establish a first frequency approximation for the system's horizontal scan oscillator.

Thereafter, the system provides a second frequency approximation by either of two different operations depending upon the type of signal applied. In the event a broadcast type signal is applied, processor 44 and horizontal range control system 43 compare the horizontal oscillator frequency to the maximum and minimum frequencies of the appropriate frequency range and implement a second frequency adjustment upon the horizontal oscillator within horizontal oscillator and control 40 until the oscillator frequency is within the appropriate frequency range.

If, on the other hand, the system is responding to a monitor signal, the second frequency approximation must be carried forward differently due to the lack of a known standard by which the frequency maximum and minimum may be known. Thus, to provide the second frequency approximation in response to monitor-type signals, horizontal oscillator range system 43 examines a sample of oscillator signals which has been frequency multiplied by some convenient multiplying factor. Different factors may be selected, however, it has been found advantageous to utilize a signal which is sixty four times the horizontal scan frequency of the system. Thus, horizontal oscillator range system 43 counts the number of frequency multiplied signals which occur between horizontal synchronization signals from sync separator 30. Thereafter, horizontal oscillator range system 43 adjusts the oscillator frequency within oscillator and control 40 until the number of frequency multiplied signals between horizontal sync signals corresponds to the predetermined muliplier (i.e. sixty four). In other words, if a frequency multiplied signal of sixty four times the horizontal scan frequency is used, the second approximation of oscillator frequency is achieved by adjusting oscillator frequency until sixty four pulses are counted between horizontal sync signals.

In either event (broadcast signal or monitor signal reception), confidence system 48 is activated following the second frequency approximation. Confidence system 48 determines whether the horizontal oscillator within oscillator and control 40 remains within the desired frequency range for a predetermined interval to establish confidence in the second frequency approximation. Once confidence is established, confidence system 48 produces an enabling signal which is coupled to oscillator and control 40 and to horizontal oscillator range system 43 to enable the phase locked loop within horizontal oscillator and control 40 (described below). As a result, the phase locked loop within horizontal oscillator and control 40 establishes frequency synchronization of the horizontal oscillator with the horizontal synchronization signals from sync separator 30. Lock detector 49 responds to the establishment of horizontal synchronization or lock and causes horizontal oscillator range system 43 to transfer the control of the horizontal scan oscillator entirely to oscillator and control system 40. Thereafter, oscillator and control 40 functions in the manner described below in greater detail to minimize static phase error and maintain frequency and phase synchronization between the horizontal scan oscillator and the reference horizontal synchronizing signals.

The synchronized output signals of horizontal oscillator and control 40 are further amplified by horizontal output 41 and applied to display 26 to produce the synchronized horizontal scan of display 26. In addition, high voltage system 42 responds to the output signal of horizontal output 41 to produce a high voltage operating potential for display 26.

Because of the adaptive character of the present invention system, it will be apparent to those skilled in the art that while the environment in which the present invention system is situated in FIG. 2 is that of a television receiver, it may be used with equal benefit in a variety of environments such as computer monitors and video game displays or other display systems.

Figure 3:
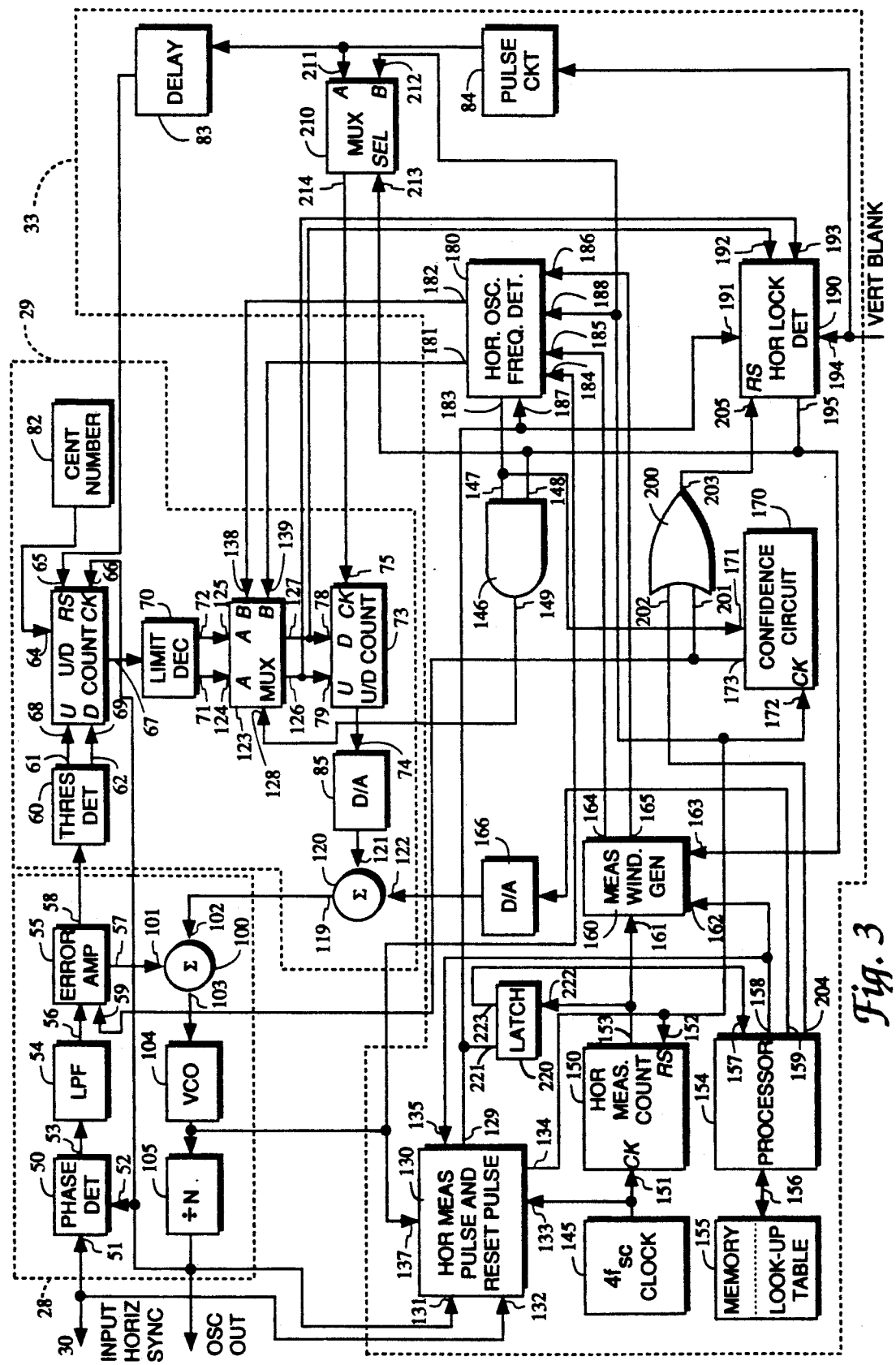
FIG. 3 sets forth a block diagram of an adaptive oscillator control system constructed in accordance with the present invention.

FIG. 3 sets forth a block diagram of the present invention horizontal scan control system generally referenced by numeral 27. By way of overview, it should be noted that the present invention system set forth in FIG. 3 forms three basic subsystem components which are shown by dashed line markings 28, 29 and 33. The portion of the present invention system enclosed within dashed line 28 comprises a phase locked loop which is operative to maintain the instantaneous or high speed corrections of the present invention system. The portion enclosed within dashed line reference 29 forms a static error corrector which responds to long term corrections within phase locked loop 28. In accordance with the above-referenced related application, the combination of phase locked loop 28 and static error corrector 29 cooperate to minimize the static phase error within the system once phase locked loop 28 has achieved frequency and phase lock. The remainder of the system of FIG. 3 enclosed within dashed line 33 provides the above-described adaptive function of the present invention system which enhances the performance of phase locked loop 28 and static error corrector 29 to accommodate a broad range of synchronization frequencies and both broadcast and monitor type signals.

With respect to phase locked loop 28, a phase detector 50 which may be constructed in accordance with conventional fabrication techniques, includes an input 51 coupled to sync separator 30 (seen in FIG. 2), an input 52 and an output 53. A low pass filter 54 is coupled to phase detector output 53. An error amplifier 55 includes an input 56 coupled to the output of low pass filter 54, an enabling signal input 59, and a pair of output 57 and 58. A summing network 100 includes an input 101 coupled to output 57 of error amplifier 55, and input 102 and an output 103. A voltage controlled oscillator 104 is coupled to output 103 of summing network 100 and to a frequency divider 105. The latter is coupled to horizontal output 41 (seen in FIG. 2) and to input 52 of phase detector 50.

Static phase error corrector 29 includes threshold detector 60 coupled to output 58 of error amplifier 55 and having a pair of outputs 61 and 62. An up/down counter 63 includes and up-counting input 68 coupled to output 61 of threshold detector 60 and a down-counting input 69 coupled to output 62 of threshold detector 60. Up/down counter 63 further includes reset input 65, a clock signal input 66 and an input 64 and an output 67. A limit decoder 70 is coupled to output 67 of up/down counter 63 and includes a pair of outputs 71 and 72. A multiplexer 123 includes a pair of inputs 124 and 125 coupled to outputs 72 and 71 respectively, a pair of inputs 138 and 139, a pair of outputs 126 and 127, and a selection input 128. An up/down counter 73 includes an up-counting input 79 coupled to output 126 of multiplexer 123 and a down-counting input 78 coupled to output 127 of multiplexer 123. Up/down counter 73 further includes an output 74 coupled to a digital to analog converter 85 and a clock signal input 75. A summing network 120 includes an input 121 coupled to converter 85, an input 122, and an output 119 coupled to input 102 of summing network 100. A pluse circuit 84 is coupled to vertical oscillator and control 31 (seen in FIG. 2). The output of pulse circuit 84 is coupled to an input of multiplexer 210, the output of which is coupled to clock signal input 75 of up/down counter 73. The output of pulse circuit 84 is further coupled to a delay network 83. The output of delay network 83 is coupled to reset signal input 65 of up/down counter 63. A center number source 82 is coupled to data input 64 of up/down counter 63.

As mentioned above, the remainder of the present invention system within dashed line 33 provides the multiple frequency operation of the present invention system which includes a horizontal measuring pulse and reset generator 130. Generator 130 includes an input 131 coupled to a source of horizontal oscillator signal at frequency divider 105, an input 132 coupled to a source of horizontal synchronization signal from sync separator 30 (seen in FIG. 2), an input 137 coupled to the output of oscillator 104. In addition, generator 130 includes an input 135, input 133 and a pair of outputs 134 and 129. A horizontal measuring counter 150 includes an output 153, a reset input 152 and a clock input 151. A clock circuit 145 produces a periodic clock signal and is coupled to input 133 of generator 130 and input 151 of horizontal measuring counter 150. Output 134 of generator 130 is coupled to reset input terminal 152 of horizontal measuring counter 150. A processor circuit 154 which, in its preferred form comprises a conventional microprocessor, includes a memory and look-up table 155. In accordance with conventional fabrication techniques, processor 154 and memory 155 are coupled via a multiple line coupling 156. Processor 154 includes an input 157 coupled to output 223 of latch 220, an output 204, an output 158 coupled to input 135 of generator 130 and an output 159 which is coupled to digital to analog converter 166, the output of which is coupled to input 122 of summer 120. An OR gate 200 includes an input 202 coupled to output 204 of processor 154, an input 201 coupled to output 173 of confidence circuit 170 and an output 203 coupled to a reset input 205 of lock detector 190. A measuring window generator 160 includes an input 161 coupled to output 153 of horizontal measuring counter 150, an input 162 coupled to output 158 of processor 154 and an input 163. Measuring window generator 160 further includes a pair of outputs 164 and 165. A confidence circuit 170 includes a clock signal input 172 coupled to output 134 of generator 130 and an output 173 coupled to input 59 of error amplifier 55. Confidence circuit 170 further includes an input 171 coupled to output 183 of horizontal oscillator frequency detector 180. Frequency detector 180 includes a reset input 188 coupled to output 134 of generator 130, a pair of inputs 185 and 186 coupled to outputs 164 and 165 of measuring window generator 160, and an output 183 coupled to input 171 of confidence circuit 170 and to input 147 of AND gate 146. Horizontal oscillator frequency detector 180 further includes a pair of outputs 181 and 182 coupled to inputs 139 and 138 respectively of multiplex circuit 123 and input 187 coupled to output 129 of generator 130. A horizontal lock detector 190 includes an input 191 coupled to output 129 of generator 130, an input 194 coupled to a source of vertical blanking signals (not shown), and a pair of inputs 192 and 193 coupled to outputs 127 and 126 respectively of multiplex circuit 123. Horizontal lock detector 190 further includes an output 195 coupled to input 163 of measuring window generator 160 and to input 148 of AND gate 146. The vertical blanking pulse applied to input 194 of horizontal lock detector 190 is further coupled to a pulse circuit 84, the output of which is coupled to input 211 of mutiplexer 210 and to delay network 83. Mutiplexer 210 includes an input 212 coupled to the output 134 of generator 130 and a selector input 213 coupled to the output 195 of horizontal lock detector 190. Multiplexer 210 includes an output 214 coupled to clock input 75 of counter 73.

In operation and by way of overview, the function of the present invention adaptive horizontal scan oscillator and control is believed best understood by initially noting that the adaptive portion of the system within dashed line 33 determines the appropriate frequency range for the horizontal oscillator 104 and then provides first and second frequency approximations and adjustments to bring the frequency of oscillator 104 into the appropriate frequency range and close enough to the correct frequency to achieve initial synchronization. Thereafter, the phase locked loop formed by combination of phase detector 50, low pass filter 54, error amplifier 55, voltage controlled oscillator 104 and frequency divider 105 is enabled and responds to changes of oscillator frequency or phase in a generally conventional manner. In the final operation, summing network 100 and the static phase error portion of the system within dashed line 29 responds to longer duration oscillator errors to reduce or eliminate static phase error.

With this overview, the present invention system may be understood in greater detail. Upon the activation of the host television receiver or monitor type environment in which the system of FIG. 3 is operated, several initial actions take place more or less simultaneously. A succession of horizontal synchronization signals are separated from the received signal and applied to horizontal measuring pulse and reset pulse generator 130. The clock circuit 145 produces crystal controlled stable peridoic high frequency clock signals. While the frequency of clock signals selected for clock circuit 145 is, to some extent, a matter of design choice, it has been found advantageous to utilize a clock signal frequency equal to four times that of the NTSC chrominance subcarrier or approximately fourteen megahertz. Thus, clock 145 produces clock signals which are applied to horizontal measuring pulse and reset pulse generator 130, and to horizontal measuring counter 150. Measuring counter 150 counts the number of clock signal pulses between resets. In addition, processor 154 produces a video-type indicative signal which is coupled to generator 130 and to measuring window generator 160. The purpose of the video-type signal is to provide an indication to the system as to the signal format being applied. Any number of conventional systems may be used to input the video-type information to processor 154, including a user switch setting. Initially, the video-type information allows the system to either go to the appropriate oscillator range for standard signals or use the following procedure for nonstandard monitor-type signals. Thus, in accordance with an important aspect of the present invention when a nonstandard signal is received, horizontal measuring counter 150 accumulates a count of input clock signal pulses which is reset at the horizontal sync signal rate by the output 134 of generator 130. Because the output of generator 130 is timed to the applied horizontal synchronization signals, the periodic reset of couter 150 produces a series of output counts at output 153 corresponding to the number of clock signal pulses occurring between horizontal sync signals. The horizontal measuring counter output 153, just prior to reset is latched by latch 220 and the latched output 223 is therefor indicative of the horizontal sync signal frequency and is coupled to processor 154 which, in accordance with the present invention, utilizes a look-up table within memory 155 to convert the output count of counter 150 to the corresponding oscillator range code number for nonstandard or monitor-type signals.

A typical look-up table may be seen in the table of FIG. 4 showing the specturm of frequencies to which the present invention system is intended to respond divided into sixteen oscillator frequency ranges. In further accordance with the present invention, each frequency range has an assigned oscillator range code number which, in the embodiment of FIG. 3, comprises a four-bit digitally encoded number. Thus, processor 154 is able to convert the number of clock signals of a nonstandard signal occurring between horizontal sync pulses and counted by counter 150 to a four-bit digitally encoded number indicative of the frequency range within which the horizontal synchronization signals are found. As mentioned, the oscillator range code of a standard signal is known and may be selected by processor 154 in response to video type. Processor 154 thereafter couples the four-bit digitally encoded oscillator range code number to digital-to-analog converter 166 which, in accordance with conventional fabrication techniques, converts the oscillator range code number to a corresponding analog signal which is applied to summing network 120. The analog signal produced by digital-to-analog converter 166 is coupled to oscillator 104 via summing networks 120 and 100 to produce an initial control signal and establish the first frequency approximation for voltage controlled oscillator 104.

With the initial frequency approximation performed, oscillator 104 produces an output signal which is approximately sixty four times the desired horizontal oscillator output signal to be utilized by the remainder of the system. Frequency divider 105 converts the output of oscillator 104 to a horizontal oscillator output signal which is coupled to horizontal measuring pulse and reset pulse generator 130 and to phase detector 150. At this point, an initial frequency approximation for oscillator 104 has been performed by the present invention system in establishing an initial oscillator range and applying a first approxmiation current to oscillator 104.

With the appropriate oscillator frequency range established and the first approximation of oscillator frequency applied, the second frequency approximation is carried forward by the present invention system. It should be noted that this second approximation involves a "finer" or more narrow frequency adjustment than provided by the first frequency approximation. It should also be noted that the second frequency approximation uses either of two processes which are determined by the type of signal being processed. As mentioned above, processor 154 produces an output signal indicative of the video-type or type of signal format being applied (e.g. NTSC, PAL, HDTV or Monitor). This video-type signal is applied to horizontal measuring pulse and reset pulse generator 130 which produces the appropriate horizontal sync measuring pulse and horizontal measuring counter reset pulse. In addition, the output of horizontal measuring counter 150 together with the video-type signal are coupled to measuring window generator 160. Measuring window generator 160 responds to the video-type signal and to the output count of measuring counter 150 to produce a pair of output signals at outputs 164 and 165 which correspond to the frequency maximum and frequency minimum of the oscillator frequency range determined by the output count of counter 150. These frequency maxima and frequency minima signals are applied to horizontal frequency detector 180.

Frequency detector 180 also receives the horizontal sync measuring pulse at input 187 and the output of oscillator 104 at input 184. The horizontal sync measuring pulse applied to input 187 comprises a signal corresponding in frequency and phase to the frequency divided horizontal output signal of oscillator 104 having a pulse width determined in accordance with the type of signal format being processed. It should be noted that oscillator 104 operates at a frequency which is sixty four times the desired horizontal output signal. As mentioned above, the second frequency approximation is also carried forward using one process in response to television broadcast signals such as NTSC, PAL, or HDTV or in an alternative process in the event a monitor type or non-standard input signal is applied.

In response to a broadcast type signal, the frequency maxima and frequency minima signals produced by measuring window generator 160 provide a pair of timing signals which are used by oscillator frequency detector 180 to determine the frequency relationship between the horizontal sync measuring pulse and the desired oscillator frequency range. This determination is carried forward by examining the timing relationship between the horizontal sync measuring pulse at input 187 and the frequency maxima and minima signals at inputs 185 and 186 respectively. Thus, in the event the horizontal sync measuring pulse occurs earlier than the frequency maxima signal at input 185, detector 180 determines that the frequency of oscillator 104 is above the desired frequency range and thus oscillator 104 leads the desired frequency range. Conversely, if the horizontal sync measuring pulse occurs after the frequency minima signal at input 186, detector 180 determines that the frequency of oscillator 104 is below the desired frequency range and thus lags the desired range. Finally, if the horizontal sync measuring pulse occurs between the frequency maxima and minima signals, oscillator 104 is within the desired frequency range, or simply, in range. Thus, horizontal oscillator frequency detector 180 compares the timing of the horizontal sync measuring pulse to the frequency maxima and frequency minima signals produced by measuring window generator 160 and provides output signals indicating whether oscillator 104 leads, lags, or is within the desired frequency range. An output signal at output 181 of frequency detector 180 indicates oscillator 104 is leading or above the desired frequency range while an output signal at output 182 indicates that oscillator 104 is lagging or below the desired frequency range. An output signal at output 183 indicates that oscillator 104 is within the desired frequency range.

The oscillator leading or oscillator lagging signals of frequency detector 180 are coupled to inputs 138 and 139 of a multiplex circuit 123. The oscillator in range output signal is coupled to input 147 of AND gate 146. The remaining input 148 of AND gate 146 is coupled to output 195 of horizontal lock detector 190. The operation of horizontal lock detector 190 is described below in greater detail. However, suffice it to note here that output 195 of lock detector 190 produces an output signal when oscillator 104 is locked or in sync. AND gate 146 includes an output 149 which is coupled to selection input 128 of multiplex circuit 123. Multiplex circuit 123 is constructed in accordance with conventional fabrication techniques and is, in essence, a switch which alternatively couples either inputs 138 and 139 or inputs 124 and 125 to outputs 126 and 127 respectively. In the absence of a signal at selection input 128, multiplex circuit 123 couples inputs 138 and 139 to outputs 126 and 127 which in turn are coupled to up-counting input 79 and down-counting input 78 of counter 73. The oscillator in range signal of frequency detector 180 is also coupled to input 171 of confidence circuit 170.

Thus, frequency detector 180 examines the timing of successive horizontal sync measuring pulses and produces output signals at either outputs 181 or 182 indicative of the frequency relationship between oscillator 104 and the desired frequency range. If, for example, oscillator 104 is too high in frequency, the comparison of horizontal sync measuring pulse and the frequency maxima signal input to detector 180 described above produces an output signal at output 181 which is coupled to down-counting input 78 of counter 73 through multiplex circuit 123. In response, counter 73 decreases its output count so long as a down-counting signal is applied to terminal 78. Conversely, in the event oscillator 104 is lower in frequency than desired, detector 180 produces an output signal at output 182 which is coupled by multiplex 123 to up-counting input 79 of counter 73 causing its output count to be increased. The output count of counter 73 is applied to digital to analog converter 85 which produces a corresponding analog control signal which is combined with the control signal from digital-to-analog converter 166 within summer 120. The output of summer 120 which now includes both the first frequency approximation control current produced by digital-to-analog converter 166 and an adjusting current corresponding to the output count of counter 73 is applied to oscillator 104 via summing network 100 to produce a further frequency correction. This process continues as frequency detector 180 continues to examine the horizontal sync measuring pulse timing and alter the output count of counter 73 accordingly to produce a further correction current. At some point in this process, equilibrium is reached and the frequency of oscillator 104 is found to be within the desired frequency range causing detector 180 to produce an oscillator in range signal at output 183. This oscillator in range signal causes confidence circuit 170 to initiate the confidence examination process described below. In addition the oscillator in range signal produces one of the necessary inputs to activate AND gate 146. The remaining input, however, remains unavailable until horizontal synchronization or lock is detected in the manner described below. At this point, however, no selection signal is applied to selection input 128 of multiplex circuit 123 and thus inputs 138 and 139 remain coupled to outputs 126 and 127. So long as frequency detector 180 continues to determine that the frequency of oscillator 104 is within range, no further correction signals are produced or applied to counter 73. Thus, so long as oscillator 104 remains in range, the output count of counter 73 remains unchanged and the control signal applied to input 121 of summer 120 remains similarly unchanged. At this point, the second frequency approximation for oscillator 104 is complete and the frequency of oscillator is determined by the combined control signals produced by digital-to-analog converters 166

(first approximation) and digital-to-analog converter 85 (second approximation).

In accordance with an important aspect of the present invention, phase lock loop 28 has remained inoperative during the first and second frequency approximations and will continue to remain inoperative until confidence circuit 170 produces an enabling signal at output 173 which is applied to enabling input 59 of error amplifier 55. Confidence circuit 170 may be provided in a number of circuit configurations and may function in response to a variety of confidence criteria. The essential function of confidence circuit 170 is to provide an indication that the above-described first and second frequency approximations have correctly placed the frequency of oscillator 104 within the appropriate oscillator frequency range. In the circuit shown in FIG. 3, confidence circuit 170 utilizes the horizontal rate reset signal of measuring counter 150 to establish a predetermined interval during which the oscillator in range signal at input 171 must be continuously maintained in order for confidence circuit 170 to produce an output signal at output 173. This output signal then enables error amplifier 55 of phase lock loop 28 once sufficient confidence has been established.

The operation of measuring window generator 160 and horizontal oscillator frequency detector 180 is carried forward in a different manner in response to a monitor-type input signal. This alternative operation is required because of the absence of a known standard for monitor-type signals. Thus, upon completion of the above-described determination of the appropriate oscillator frequency range and the establishment of the initial control current by converting the corresponding oscillator control range number to an appropriate control current by digital-to-analog converter 166, frequency detector 180 performs the second frequency approximation for monitor-type signals by counting the number of input pulses applied to input 184 between the occurrence of horizontal sync measuring pulses at input 187. It is desired that the frequency of oscillator 104 be sixty four times that of the incoming horizontal sync signals. Thus, in the event frequency detector 180 counts more than sixty four input pulses at input 184 between horizontal sync measurig pulse inputs at input 187, an oscillator leading condition has been detected and a correcting signal is produced at output 181. Conversely, in the event frequency detector 180 counts fewer than sixty four input pulses at input 184 between horizontal sync measuring pulses, an oscillator lagging or too slow condition has been detected and a corresponding correction signal is applied to output 182. The operation of multiplex circuit 123 and up/down counter 73 in response to the output signals of frequency detector 180 in the monitor mode of operation is identical to that set forth above and thus the output count of counter 73 is adjusted until the control signal resulting from the conversion of the output count of counter 73 and applied to oscillator 104 alters the frequency of oscillator 104 to produce approximately sixty four pulse signals at input 184 between horizontal sync measuring pulses. At this point, frequency detector 180 produces an oscillator in range signal at output 183 which is processed by confidence circuit 170 in the manner described above until a predetermined confidence is established and phase lock loop 28 is activated by enabling amplifier 55. Once confidence has been established and phase lock loop 28 has been enabled, the system again performs in the same manner regardless of which type of signal input is provided. Thus, the enabling of error amplifier 55 by the confidence signal at input 59 closes the operational loop of phase lock loop 28.

Phase detector 50 responds to the simultaneous application of reference horizontal sync signals from sync separator 30 (seen in FIG. 2) and a sample of the frequency divided output of oscillator 104. In accordance with conventional fabrication techniques, phase detector 50 produces an error signal at output 53 which is coupled by low pass filter 54 to the input of error amplifier 55. Amplifier 55 imposes a predetermined signal gain upon the applied error signal which is operative upon voltage controlled oscillator 104 to shift the frequency of oscillation thereof. In further accordance with conventional fabrication techniques, voltage controlled oscillator 104 operates at a predetermined multiple (in this case sixty four) of the desired horizontal scan frequency. Thus, to produce the desired horizontal output signal, the output signal of voltage controlled oscillator 104 is frequency divided by this predetermined frequency multiple. The output signal is coupled to phase detector input 52 and to horizontal output system 41 (seen in FIG. 2). Frequency or phase errors between the sample of frequency divided oscillator output signal at input 52 of phase detector 50 and reference synchronizing signals at input 51 produce appropriate error voltages at output 53 which are amplified and applied to oscillator 104 to adjust the frequency of oscillator 104 until the frequency divided oscillator signal again corresponds in frequency and phase to the reference sync pulses.

Horizontal lock detector 190 includes a pair of inputs 192 and 193 which are coupled to inputs 78 and 79 respectively of counter 73. Lock detector 190 is also coupled to a source of vertical blanking signal at input 194 and a source of horizontal sync measuring pulse at input 191. Horizontal lock detector 190 monitors the input signals to counter 73 and, upon establishing the absence of correcting signal inputs to counter 73 for a predetermined period of time, produces a horizontal lock output signal at output 195. As mentioned above, this horizontal lock signal forms the second input at input 148 of AND gate 146. Thus, with input signals to gate 146 which simultaneously indicate an oscillator in range condition and the attainment of horizontal lock by phase lock loop 28, AND gate 146 produces an output signal at output 149 which is applied to selection input 128 of multiplex 123. In response, multiplex 123 switches the coupling to outputs 126 and 127 away from inputs 138 and 139 respectively to inputs 124 and 125. This switching of multiplexer 123 causes counter 73 to be decoupled from inputs 138 and 139 and further control of counter 73 is provided by the static phase error correction portion of the present invention system enclosed within dashed line 29. Processor 154 produces a high output signal at output 204 in the absence of incoming horizontal sync signals. OR gate 200 resets horizontal lock detector 190 if horizontal sync is absent or if a frequency adjustment is required.

At this point, the present invention system has determined the appropriate frequency range for oscillator 104, completed first and second frequency approximations to place the oscillator within the desired range, established confidence and activated phase locked loop 28 to achieve synchronization. The objective of the remainder of the present invention system is to reduce any static phase error occurring by ignoring short duration or small magnitude frequency and phase correction and instead responding solely to large magnitude frequency corrections having an extended duration. As is set forth in the above identified related application, threshold detector 60 and counter 63 respond to detect large frequency corrections and to average such changes over a vertical scan interval. Limit decoder 70 responds to the occurrence of substantial count changes of counter 63 to produce up-counting or down-counting signals which are coupled by multiplexer 123 to counter 73 changing its output count and the control signal applied to oscillator 104 which, in effect, shifts the static or free-running frequency of oscillator 104 to remove the need for the large magnitude long duration corrections and avoid objectionable static phase error.

More specifically, the output of threshold detector 60 is unresponsive to the phase locked loop error signal unless and until it rises above or drops below a predetermined upper and lower signal amplitude limit. However, in the event the error signal exceeds a predetermined upper threshold or drops below a lower threshold, an output signal is produced at output 61 or 62 of threshold detector 60.

Up/down counter 63 comprises a conventional up-/down counter which responds to an up-counting signal at input 68 to increase its count or to a down-counting signal at input 69 to decrease its count. The clock input of up/down counter 63 is coupled to the output of frequency divider 105. Thus, up/down counter 63 counts upwardly at the horizontal output signal rate whenever input 68 is energized or downwardly whenever input 69 is energized and remains unchanged in the absence of both. In addition, a vertical rate reset pulse is produced by pulse circuit 84 in response to an input vertical blanking signal from vertical oscillator and control 31. This vertical rate reset pulse is delayed by a delay network 83 and applied to reset terminal 65. Also, a predetermined center count number stored in center number circuit 82 is applied to the data input of counter 63 each time a reset pulse is applied to reset input 65. Thus, in normal operation and in the absence of an input signal from threshold detector 60, counter 63 is reset at the vertical scan rate to produce an output count at terminal 67 which corresponds to the predetermined center number stored in circuit 82. This process continues and the output of counter 63 at output terminal 67 remains constant at the predetermined center number so long as no signal is applied to up-counting terminal 68 or down-counting terminal 69. If however, the amplitude of error signal produced by phase detector 50 exceeds either limit, indicating of a large frequency correction of oscillator 104, the output count of counter 63 is changed accordingly.

Limit detector 70 responds to the output count of counter 63 and compares the output count to predetermined high and low count limits. In the event an increased count beyond the upper limit is decoded, output 71 which is coupled to up-counting terminal 79 of counter 73 by multiplexer 123 is energized. Conversely, output counts of counter 63 below the lower limit result in an output signal at terminal 72 which is also coupled to down-counting terminal 78 of counter 73 by multiplexer 123. In the absence of output counts from counter 63 exceeding either count limit, limit decoder 70 does not energize either up-counting terminal 79 or down-counting terminal 78.

Because the output count of counter 73 is converted to a corresponding analog signal by digital to analog converter 85 in the manner described above and applied to input 102 of summer 100, changes of the output count of counter 73 produce corresponding changes of the control signal applied to input 102 of summer 100. The control signal applied to voltage controlled oscillator 104 is the combination of inputs 101 and 102 and therefore, changes at input 102 causes corresponding changes of frequency of voltage controlled oscillator 104.

The output count of counter 73 continues to be adjusted by threshold detector 60, counter 63 and limit decoder 70 until the frequency of oscillator 104 is established at the correct free-running frequency as indicated by the absence of error signals within phase lock loop 28 sufficient to activate threshold detector 60. Thereafter, the control signal provided by counter 73 and digital-to-analog converter 85 together with the oscillator range control derived control signal provided by digital-to-analog converter 166 remain constant and minor frequency and phase corrections are made by phase lock loop 28 to maintain the synchronization of oscillator 104.

FIG. 4 sets forth an exemplary look-up table used by the present invention system and generally referenced by numeral 175. Table 175 includes a first column 176 headed ORC and a pair of numeric columns 177 and 178. Column 176 displays the oscillator range control numbers corresponding to the sixteen frequency ranges within which the overall frequency spectrum of the present invention system is required to perform. It will be apparent to those skilled in the art that the frequency spectrum of any given system may be divided into different numbers of oscillator ranges without departing from the spirit and scope of the present invention. Columns 177 and 178 set forth numbers corresponding to the accumulated clock signal counts derived by horizontal measuring counter 150 (seen in FIG. 3) which occurred between horizontal synchronization signals in the manner described above. Column 177 sets forth numbers corresponding to the upper frequency limit of each corresponding oscillator range while the numbers set forth in column 178 correspond to the lower limits of each corresponding oscillator frequency range. Examination of table 175 reveals that each oscillator frequency range overlaps the adjacent range. This has been found advantageous in that it provides a hysteresis effect for the present invention system which is necessary to assure that the occurrence of synchronization frequencies at or near the limit of an oscillator frequency range will not cause the system to become unstable and oscillate between ranges. While any number of priority systems may be used to resolve this overlap, it has been found advantageous to configure memory 155 and processor 154 (seen in FIG. 3) to select the oscillator frequency range which initially is encountered.

What has been shown is an adaptive multiple frequency range oscillator and control system which accommodates a wide spectrum of scan frequencies within a single oscillator and control system. This system shown divides the spectrum of oscillator frequencies into a plurality of oscillator ranges and places the oscillator frequency within a selected range based upon examination of the horizontal synchronization signals of the incoming signal. The system is able to accommodate virtually any standard broadcast system as well as a great variety of auxiliary or monitor type signal sources such as personal computers or the like. The system provides both the accommodation of a broad spectrum of scan frequencies without sacrificing the frequency and phase stability of the system.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. For use within a system receiving an information signal and a periodic reference signal, an oscillator control for controlling the frequency and phase of an oscillator in accordance with a periodic reference signal having a frequency within a spectrum of reference frequencies, said oscillator control comprising:

oscillator frequency range means for establishing a plurality of osciallator frequency ranges within said spectrum of reference frequencies;

oscillator range control means for identifying one of said frequency ranges which includes the frequency of said reference signal;

an oscillator having a free-running frequency and producing an oscillator signal and having frequency change means for changing the frequency of said oscillator signal from said free-running frequency in response to a control signal;

first approximation means for responding to said frequency range identification to provide a first approximation control signal and applying it to said frequency change means to change said oscillator frequency to a first frequency approximation;

second approximation means for determining the frequency relationship between said oscillator signal and said identified one of said frequency ranges and producing a second frequency approximation signal coupled to said frequency change means to cause the frequency of said oscillator signal to fall within a frequency window narrower than and defined within said identified one of said frequency ranges;

confidence means for detecting the maintenance of said oscillator signal within said identified one of said frequency ranges for a predetermined interval and for producing an enabling signal;

detector means coupled to said oscillator for comparing the frequency and phase of said oscillator signal to said reference signal and producing an error signal indicative of the difference therebetween; and feedback means for coupling said error signal to said frequency change means as a control signal in response to said enabling signal.

2. An oscillator control as set forth in claim 1 further including:

static phase error means for detecting the presence of static phase error between said oscillator signal and said reference signal; and static phase adjustment means for adjusting the free-running frequency of said oscillator to reduce the detected static phase error.

3. An oscillator control as set forth in claim 2 wherein said system may receive information signals and periodic reference signals which are either standard broadcast signals or nonstandard and wherein said oscillator control system includes signal type means for receiving an input video-type signal indicative of the type of information signal and periodic reference signal being received.

4. An oscillator control as set forth in claim 3 wherein said oscillator range control means include means responsive to said video-type signal for identifying said one of said frequency ranges either solely in response to the video-type signal when a standard broadcast signal is received or solely in response to the time interval between said periodic reference signals when a nonstandard signal is received.

5. An oscillator control as set forth in claim 4 wherein said oscillator range control means include:

a clock producing a clock signal having a frequency at least several times greater than said reference signal;

a counter coupled to said clock producing an output count of clock signals;

reset means for resetting the output count of said counter in response to said reference signal; and latch means for latching the output count of the counter one clock signal prior to the reset.

6. An oscillator control as set forth in claim 5 wherein said frequency ranges within said plurality of frequency ranges include an identifying oscillator range code number.

7. An oscillator control as set forth in claim 6 wherein said oscillator range control means include a look-up table having said frequency ranges expressed in terms of the output count of said counter for the frequency maxima and minima and the associated oscillator range code number.

8. An oscillator control as set forth in claim 7 wherein said first approximation means include means for converting the oscillator range code number for the identified frequency range to said first approximation control signal.

9. An oscillator control as set forth in claim 8 wherein said second approximation means includes:

means for providing frequency maxima and frequency minima signals corresponding to the maximum and minimum frequencies of the identified frequency range; and means for determining whether said oscillator signal leads, lags or is within the identified frequency range by comparing the oscillator signal to the frequency maxima and minima signals.

10. An oscillator control as set forth in claim 9 wherein said means for determining includes means for examining the timing relationship between said reference signal and said frequency maxima and minima signals.

11. An oscillator control as set forth in claim 10 wherein said second approximation means include first means for activating said means for providing and said means for determining solely in response to an indication of standard broadcast signals.

12. An oscillator control as set forth in claim 11 wherein said second approximation means include:

counting means for counting the number of oscillator signals occurring during the period of said reference signal;

comparison means for comparing the number of oscillator signal counted to a predetermined number and determining that the oscillator leads, lags or is within the identified frequency range if the count is more than, less than or equal to the predetermined number; and second means for activating said counting means and comparison means solely in response to an indication of non-standard signals.

13. An oscillator control as set forth in claim 12 wherein said first and second means for activating are combined and operate in response to said video-type signal.

14. An oscillator control system as set forth in claim 1 wherein said frequency ranges within said spectrum of reference frequencies overlap.

15. An oscillator control system as set forth in claim 14 wherein said information signal is a video signal and said reference signal is a sync signal.

16. For use within a system receiving an information signal and a periodic reference signal, a method for controlling the frequency and phase of an oscillator in accordance with the periodic reference signal having a frequency within a spectrum of reference frequencies comprising the steps of:

establishing a plurality of oscillator frequency ranges within said spectrum of reference frequencies;

determining an identified one of said frequency ranges within which said reference signal falls;

performing a first approximation frequency adjustment of said oscillator responsive to said identified one of said frequency ranges;

evaluating the frequency relationship between said oscillator signal and said identified one of said frequency ranges;

performing a second approximation frequency adjustment of said oscillator until said oscillator frequency in within said identified one of said frequency ranges;

monitoring the consistency with which said oscillator signal remains within said identified one of said frequency ranges for a predetermined interval to establish a confidence level;

comparing the frequency and phase of said oscillator signal to that of said reference signal to produce an error signal indicative of the difference therebetween; and dynamically adjusting the frequency of said oscillator in addition to said first and second approximation frequency adjustments in response to said error signal once said confidence level is established to frequency and phase lock said oscillator to said reference signal.

17. The method of claim 16 further including the steps of:

detecting the presence of static phase error between said oscillator signal and said reference signal;

averaging the static phase error over a predetermined time period; and adjusting the free-running frequency of said oscillator to reduce the static phase error.

18. The method of claim 17 wherein said step of establishing a plurality of oscillator frequency ranges includes assigning a corresponding number for each frequency range and wherein said step of performing a first approximation frequency adjustment includes the step of converting the number corresponding to said identified one of said frequency ranges to an oscillator frequency control signal.

19. The method of claim 18 wherein said reference signal may be either standard and related to the information signal by a known standard or may be nonstandard and not related by a known standard and wherein said step of determining an identified one of said frequency ranges includes the steps of:

responding to a standard reference signal by selecting said identified frequency range using a known standard; or accommodating a nonstandard reference signal by timing the interval between reference signals.

20. The method of claim 19 wherein said step of accommodating a nonstandard said reference signal includes:

producing a clock signal having a stable frequency which is substantially greater than that of said reference signal; and counting the number of clock signals occurring between reference signals to produce a number related to the frequency of said reference signal.

21. The method of claim 16 wherein said step of evaluating includes the steps of:

producing frequency maxima and frequency minima signals corresponding to the maximum and minimum frequencies of said identified one of said frequency ranges; and finding whether said oscillator signal leads, lags or is within said identified one of said frequency ranges by comparing the oscillator signal to the frequency maxima and minima signals.

22. The method of claim 16 wherein said evaluating step includes the step of:

counting the number of oscillator signals occurring between said reference signals.

23. The method of claim 22 wherein said counting step includes frequency multiplying said oscillator signal.

24. For use within a system receiving a video signal and a periodic sync signal, a horizontal scan oscillator control for controlling the frequency and phase of a horizontal scan oscillator in accordance with a periodic sync signal having a frequency within a spectrum of reference frequencies, said oscillator control comprising:

oscillator frequency range means for establishing a plurality of oscillator frequency ranges within said spectrum of reference frequencies;

oscillator range control means for identifying one of said frequency ranges which includes the frequency of said reference signal;

a horizontal scan oscillator having a free-running frequency and producing a horizontal oscillator signal and having frequency change means for changing the frequency of said horizontal scan oscillator signal from said free-running frequency in response to a control signal;

first approximation means for responding to said frequency range identification to provide a first approximation control signal and applying it to said frequency change means to change said horizontal scan oscillator frequency to a first frequency approximation;

second approximation means for determining the frequency relationship between said horizontal scan oscillator signal and said identified one of said frequency ranges and producing a second frequency approximation signal coupled to said frequency change means to cause the frequency of said oscillator signal to fall within a frequency window narrower than and defined within said identified one of said frequency ranges;

a horizontal phase locked loop responsive to said sync and oscillator signals operative upon said horizontal scan oscillator; and confidence means establishing confidence by detecting the maintenance of said oscillator signal within said identified one of said frequency ranges for a predetermined interval and for activating said phase locked loop once confidence is established.

25. An oscillator control as set forth in claim 24 wherein said video signal and periodic sync signal are portions of a standard broadcast signal and wherein said second approximation means includes means for generating a first pair or timing pulses corresponding to the first frequency maxima and minima of said first frequency window and means for generating a second pair of timing pulses corresponding to second frequency maxima and minima of a second frequency window once said oscillator is locked to said sync signal, said second frequency window being wider than said first frequency window.

26. An oscillator control as set forth in claim 25 further including:

means for enabling said phase locked loop in response to said confidence means; and static phase error means, responsive to said confidence means and a lock condition of said oscillator to said sync signal, for determining average static phase error of said oscillator, and means for adjusting said oscillator in response to static phase error during locked contition and in response to said first and second approximation means in the absence of locked condition.

27. A method for controlling a horizontal oscillator forming part of a phase locked loop in response to a received horizontal sync signal, said method comprising:

operating said oscillator in response to a control signal within a spectrum of frequencies divided into a plurality of frequency ranges including the frequency of the received sync signal for generating an oscillator signal representing the received signal to a first approximation by placing the frequency of said oscillator within the same frequency range as said sync signal; and modifying said control signal is response to a frequency comparison of said oscillator and sync signals for adjusting the frequency of said oscillator signal for representing the frequency of the received sync signal to a second more precise approximation and establishing confidence in the accuracy of said second approximation and enabling said phase locked loop in response to establish confidence.

28. The method of claim 27 wherein said received horizontal sync signal may be either standard or nonstandard and wherein the modifying step is in response to sync signal type.

* * * * *